(12) United States Patent
Nakanishi et al.

(10) Patent No.: US 7,859,831 B2
(45) Date of Patent: Dec. 28, 2010

(54) ELECTRO-OPTICAL DEVICE AND ELECTRONIC APPARATUS

(75) Inventors: Daisuke Nakanishi, Matsumoto (JP); Yasunori Onishi, Azumino (JP)

(73) Assignee: Epson Imaging Devices Corporation (JP)

( * ) Notice: Subject to any disclaimer, the term of this patent is extended or adjusted under 35 U.S.C. 154(b) by 210 days.

(21) Appl. No.: 12/146,551

(22) Filed: Jun. 26, 2008

(65) Prior Publication Data

US 2009/0002924 A1 Jan. 1, 2009

(30) Foreign Application Priority Data

Jun. 27, 2007 (JP) ............................. 2007-168594
May 2, 2008 (JP) ............................. 2008-120212

(51) Int. Cl.
*G06F 1/16* (2006.01)
*G02F 1/1333* (2006.01)
*G09G 5/00* (2006.01)
*H04M 1/00* (2006.01)

(52) U.S. Cl. ........................... 361/679.24; 361/679.21; 349/58; 345/156; 455/575.1

(58) Field of Classification Search ............. 349/58–60; 361/679.01–679.45, 679.55–679.59; 345/156, 345/157, 168, 169; 455/575.1, 575.3, 575.4
See application file for complete search history.

(56) References Cited

U.S. PATENT DOCUMENTS

| | | | | |
|---|---|---|---|---|
| 5,666,172 A | * | 9/1997 | Ida et al. | 349/58 |
| 6,559,907 B1 | * | 5/2003 | Byoun | 349/58 |
| 6,870,582 B2 | * | 3/2005 | Hayashimoto et al. | 349/58 |
| 7,113,237 B2 | * | 9/2006 | Nitto et al. | 349/58 |
| 7,220,045 B2 | * | 5/2007 | Chang | 362/633 |

FOREIGN PATENT DOCUMENTS

| | | |
|---|---|---|
| JP | 06-082782 | 3/1994 |
| JP | 09-005744 | 1/1997 |
| JP | 2002-055329 | 2/2002 |
| JP | 2005-099616 | 4/2005 |
| JP | 2005-283826 | 10/2005 |

* cited by examiner

*Primary Examiner*—Jayprakash N Gandhi
*Assistant Examiner*—Nidhi Desai
(74) *Attorney, Agent, or Firm*—Harness, Dickey & Pierce, P.L.C.

(57) ABSTRACT

An electro-optical device includes an electro-optical panel and a holder that directly or indirectly holds the electro-optical panel. At least a part of the holder is formed of a metallic plate, and the at least part of the holder includes a turned-down portion formed by folding a part of a base portion of the metallic plate. The end of the turned-down portion forms a step that holds another component.

9 Claims, 7 Drawing Sheets

ELECTRO-OPTICAL DEVICE AND ELECTRONIC APPARATUS

BACKGROUND

1. Technical Field

The present invention relates to electro-optical devices and electronic apparatuses, and in particular, relates to structures of electro-optical devices suitable for a case where metallic plates constitute at least parts of holders that hold electro-optical panels directly or indirectly.

2. Related Art

In general, liquid-crystal displays serving as electro-optical devices having liquid-crystal display panels attached to frame units formed of synthetic-resin components or metallic plates are well known. The liquid-crystal display panels are installed in electronic apparatuses via the frame units. An example of such frame units includes a lower frame or a supporting frame (accommodating member) that supports a liquid-crystal display panel from the bottom thereof and an upper frame or a holding frame (attachment member) that holds the liquid-crystal display panel from a side adjacent to a position of observation. Liquid-crystal displays having a structure in which liquid-crystal display panels are held between such upper and lower frames are well known (for example, see JP-A-2005-99616 and JP-A-2005-283826).

Recently, demand for electronic apparatuses such as cellular phones and portable information terminals reduced in size and thickness has been increasing, and as a result, it has been necessary to reduce the thickness of frame structures of, for example, the above-described liquid-crystal displays installed in the electronic apparatuses. This prevents the maintenance of the frame strength for ensuring, for example, impact resistance. To avoid this, metallic frames formed of metallic plates are increasingly being used for the frame structures.

However, thickness reduction and impact resistance still need to be compatible with each other even when metallic frames formed of metallic plates are used, and it has been difficult to maintain sufficient rigidity even when metallic plates are used due to recent further development of lower-profiled electro-optical devices.

Moreover, such frames formed of metallic plates often have, for example, engaging projections formed by cutting or bending parts of the metallic plates, or have openings engaged with engaging projections formed on other members. These engaging structures further reduce the frame strength, and prevent maintenance of sufficient rigidity.

Furthermore, various restrictions are imposed on the shapes of holders formed of metallic plates compared with resin frames formed by resin molding, and reduce the design flexibility. This prevents improvements in, for example, holding, supporting, and positioning functions of liquid-crystal display panels from being made.

SUMMARY

An advantage of some aspects of the invention is that an electro-optical device with sufficient strength is provided by improving the frame structure without going against the demand for reductions in size and thickness.

An electro-optical device according to a first aspect of the invention includes an electro-optical panel and a holder that directly or indirectly holds the electro-optical panel. At least a part of the holder is formed of a metallic plate, and the at least part of the holder includes a turned-down portion formed by folding a part of a base portion of the metallic plate. The end of the turned-down portion forms a step that holds another component.

According to the first aspect of the invention, the portion formed of a metallic plate in the holder includes the turned-down portion formed by folding the part of the base portion of the metallic plate and the step formed by the end of the turned-down portion and the base portion, and the step holds the other member. Since a bent portion is formed between the base portion and the turned-down portion, the rigidity of the bent portion can be increased, and at the same time, the engaging strength at the step formed by the end of the turned-down portion and the base portion can be increased in accordance with the length of the turned-down portion regardless of the thickness of the metallic plate. Furthermore, the step formed by the end of the turned-down portion and the base portion serves as an engaging structure without the need for a notch or an opening formed in the metallic plate, resulting in an increase in the design flexibility of the holder that is at least partially formed of a metallic plate. Therefore, demand for reductions in size and thickness can be met while the impact resistance of the electro-optical device is ensured.

It is preferable that the other component includes a first member held by the holder via the step of the holder and a second member held by the first member. In this case, the first member and the second member can be held by one step. Accordingly, the case that accommodates the electro-optical panel can be easily assembled.

It is preferable that the metallic plate is disposed in at least a part of an area overlapped with the electro-optical panel when viewed in plan such that a sidewall is bent and extends from the at least part of the area and is located adjacent to the periphery of the electro-optical panel, and the turned-down portion forms the step on the sidewall. When the step formed by the turned-down portion is disposed on the sidewall, the rigidity of the sidewall can be increased, and the other member can also be held more easily.

An electro-optical device according to a second aspect of the invention includes an electro-optical panel, an accommodating member with a bottom surface and sidewalls accommodating the electro-optical panel, steps formed on the sidewalls of the accommodating member, and a supporting member disposed inside the accommodating member between the steps and the bottom surface of the accommodating member and supporting the electro-optical panel.

According to the second aspect of the invention, the supporting member that supports the electro-optical panel is disposed between the steps and the bottom surface. Therefore, the position of the electro-optical panel is uniquely determined in accordance with the arrangement of the steps and the bottom surface, and the accuracy in positioning the electro-optical panel can be improved compared with the case where other fixing devices are used.

It is preferable that the steps are formed by folding the sidewalls. The strength of the accommodating member can be increased since the effective thickness of the sidewalls is increased by folding the sidewalls.

An electro-optical device according to a third aspect of the invention includes an electro-optical panel, an accommodating member with a bottom surface and sidewalls accommodating the electro-optical panel from one of the upper and lower sides of the panel, an attachment member with a bottom surface and sidewalls accommodated in the accommodating member from the other side of the electro-optical panel, steps formed at least on the sidewalls of the accommodating member or between the sidewalls of the accommodating member and the attachment member, and a supporting member disposed inside the accommodating member between the bottom surface of the accommodating member and the steps formed on the sidewalls of the accommodating member or the steps formed between the sidewalls of the accommodating member and the attachment member and supporting the electro-optical panel.

According to the third aspect of the invention, the accommodating member, the attachment member, and the supporting member that supports the electro-optical panel are fixed via the steps. Therefore, the displacement of these components can be prevented even when stress is applied.

It is preferable that the steps are formed on the accommodating member, and a part of the attachment member and the supporting member are disposed between the bottom surface of the accommodating member and the steps. When the part of the attachment member and the supporting member are disposed between the steps and the bottom surface, the positional relationship among the accommodating member, the attachment member, and the supporting member is determined and fixed. With this, the displacement of these components can be prevented even when stress is applied.

It is preferable that the steps are formed by folding the sidewalls. The strength of the accommodating member can be increased since the effective thickness of the sidewalls is increased by folding the sidewalls.

An electro-optical device according to a fourth aspect of the invention includes an electro-optical panel, an accommodating member with a bottom and sidewalls accommodating the electro-optical panel from one of the upper and lower sides of the panel, steps formed on the sidewalls of the accommodating member, and an attachment member accommodated in the accommodating member from the other side of the electro-optical panel, at least a part of the attachment member being disposed between the steps and the bottom surface of the accommodating member.

According to the fourth aspect of the invention, the accommodating member and the attachment member are directly engaged with and fixed to each other without other members. In this case, dimensional errors can be prevented compared with the case where the accommodating member and the attachment member are engaged with each other together with other members.

It is preferable that the steps are formed by folding the sidewalls. The strength of the accommodating member can be increased since the effective thickness of the sidewalls is increased by folding the sidewalls.

It is preferable that the other component is composed of resin, and is integrated into the metallic plate. With this, mechanical strength can be improved by using a metallic plate for the sidewall, and at the same time, the supporting member can be deformed when the other component is composed of resin. Thus, the components can be engaged with each other more closely.

It is preferable that the metallic plate includes a resin component integrated outside the metallic plate. With this structure, the strength of the accommodating member can be improved.

It is preferable that the holder has an opening in an area corresponding to the position of the step of the holder. With this structure, the flexibility in the shape and dimensions of the step can be increased due to a clearance corresponding to the thickness of the sidewall.

An electronic apparatus according to another aspect of the invention includes one of the above-described electro-optical devices and a controller of the electro-optical device. When this electronic apparatus is applied to, for example, cellular phones, portable information terminals, and car-mounted displays whose thicknesses are required to be reduced, in particular, high impact resistance can be ensured.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
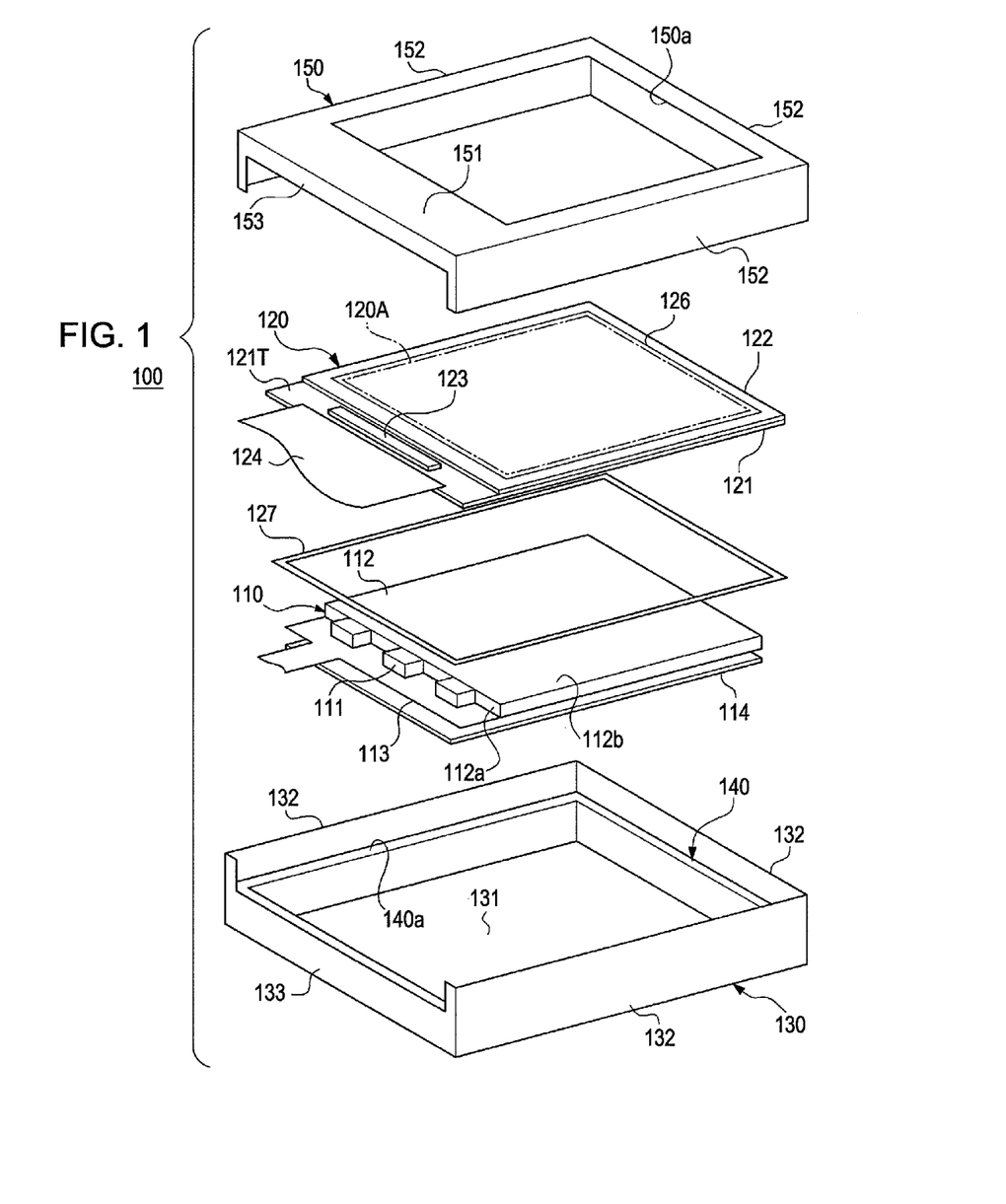
FIG. 1 is a schematic exploded perspective view of an electro-optical device according to embodiments of the invention.

Next, an embodiment of the invention will be described in detail with reference to the drawings. FIG. 1 is a schematic exploded perspective view of an electro-optical device (liquid-crystal display) 100 according to this embodiment. This electro-optical device 100 includes a lighting unit 110 constituting a backlight, an electro-optical panel (liquid-crystal display panel) 120 disposed at the front side (a side adjacent to a position of observation) of the lighting unit 110, and a holder including a supporting frame 130 serving as an accommodating member that accommodates the lighting unit and the electro-optical panel, an inner frame 140 serving as a supporting member, and a holding frame 150 serving as an attachment member.

The lighting unit 110 includes light sources 111 formed of, for example, light emitting diodes (LEDs) or cold-cathode tubes and a light guiding plate 112 that receives light emitted from the light sources 111 at a light receiving surface (end surface) 112a and emits light from a light emitting surface (top surface) 112b. Herein, the light sources 111 are mounted on a wiring board (flexible wiring board) 113 so as to be aligned in the longitudinal direction of the light receiving surface 112a. Moreover, a reflective sheet 114 is disposed behind the light guiding plate 112. Furthermore, an optical sheet (not shown) is preferably disposed on the light emitting surface 112b. Herein, the light guiding plate 112 is rectangular when viewed in plan.

The electro-optical panel 120 includes transparent substrates 121 and 122 composed of, for example, glass bonded to each other with an electro-optical material (not shown; liquid crystal) interposed therebetween. The substrate 121 has a projecting portion 121T projecting from the substrate 122, and a driving circuit 123 and a wiring board (flexible wiring board) 124 for inputting signals, for example, are mounted on the projecting portion 121T. Sheet polarizers 126 are disposed on (bonded to) the outer surfaces of the substrates 121 and 122 if required (the sheet polarizer on the outer surface of the substrate 121 is not illustrated). The electro-optical panel 120 is rectangular when viewed in plan, and the display area 120A thereof is also rectangular.

The supporting frame 130 is rectangular when viewed in plan, and includes a bottom surface 131 and four sidewalls 132 and 133 extending upward from the periphery of the bottom surface 131. The three sidewalls 132 form a rectangle with an opening, and the upper end of the remaining sidewall 133 is slightly lower than the upper ends of the sidewalls 132 such that an outlet for the wiring boards 113 and 124 is left even after the holding frame 150 is attached as described below. The inner frame 140 is accommodated inside the supporting frame 130, and the lighting unit 110 is accommodated inside the inner frame 140. Moreover, the electro-optical panel 120 is supported on a panel supporting surface 140a of the inner frame 140 via, for example, a double-sided adhesive tape 127 if required.

In the example shown in FIG. 1, the holding frame 150 is attached so as to cover the electro-optical panel 120 from the top thereof. The holding frame 150 has an opening at a lower portion thereof, and can be attached to the supporting frame 130. The holding frame 150 further has a display window 150a that allows the display area 120A of the electro-optical panel 120 to be visible from the side adjacent to a position of observation (from above in FIG. 1) at an upper portion of the holding frame. The holding frame 150 includes a top surface 151 having the display window 150a and sidewalls 152 and 153 extending downward from the periphery of the top surface 151. The holding frame 150 is rectangular when viewed in plan, and is slightly smaller than a planar shape corresponding to the supporting frame 130, that is, the supporting frame 130 in the example shown in FIG. 1 such that the sidewalls 152 and 153 thereof are fitted inside the sidewalls 132 and 133 of the supporting frame 130. The three sidewalls 152 form a rectangle with an opening so as to correspond to the sidewalls 132 of the supporting frame 130, and the lower end of the remaining sidewall 153 is higher than the lower ends of the sidewalls 152 such that the above-described outlet is formed between the lower end of the sidewall 153 and the upper end of the sidewall 133 of the supporting frame 130 in an assembled state.

EXAMPLE 1

Figure 2:
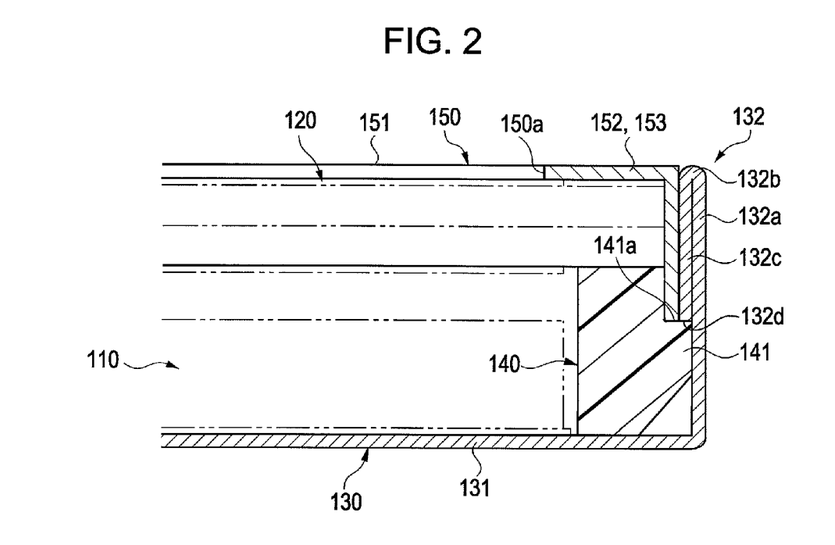
FIG. 2 is a fragmentary sectional view schematically illustrating the structure of a sidewall of a supporting frame of Example 1 according to a first embodiment.

FIG. 2 is a fragmentary sectional view schematically illustrating a specific structure of Example 1 according to the above-described embodiment. An engaging structure for fixing the inner frame 140 to the supporting frame 130, for example, is provided for the structure of Example 1. As shown in FIG. 2, for example, this engaging structure is formed between the inner surfaces of the sidewalls 132 of the supporting frame 130 and the outer peripheral surfaces of the inner frame 140. The sidewalls 132 of the supporting frame 130 each include a base portion 132a extending upward from the bottom surface 131, a bent portion 132b formed at the upper end of the base portion 132a that is folded inward, and a turned-down portion 132c superposed on the inner surface of the base portion 132a from the bent portions 132b. The ends of these turned-down portions 132c are located at a predetermined position in the height direction of the base portions 132a, and the end surfaces of the ends form steps 132d inside the base portions 132a.

Projections 141 are formed on the outer peripheral surfaces of the inner frame 140, and the top surfaces of the projections 141 form steps 141a. When the inner frame 140 is inserted into the supporting frame 130, the projections 141 of the inner frame 140 are brought into contact with the turned-down portions 132c formed on the inner surfaces of the sidewalls 132, and are guided into the supporting frame 130 while deforming the sidewalls 132 slightly outward. When the steps 141a are placed under the steps 132d formed inside the supporting frame 130, the inner frame 140 is held between the steps 132d and the bottom surface 131, and retained by the supporting frame 130. Subsequently, the electro-optical panel 120 is fixed between the sidewalls 152 and 153 of the holding frame 150 and the inner frame 140.

In the example shown in FIG. 2, the supporting frame 130 can be formed of a metallic plate, and the inner frame 140 can be composed of a synthetic resin such as white polyethylene. In this case, the engaging state shown in FIG. 2 can be achieved mainly by the elastic deformation of the supporting frame 130. However, the material of the inner frame 140 is not limited to a synthetic resin, and the inner frame 140 can be formed of, for example, a metallic plate as is the supporting frame 130.

In this example, the sidewalls 132 of the supporting frame 130 have the bent portions 132b at the upper portions thereof, and the turned-down portions 132c are superposed on the base portions 132a. With this, the rigidity of the sidewalls 132 can be increased, and the engaging strength can also be significantly increased since the rigidity of the steps 132d is increased in accordance with the length of the turned-down portions 132c from the bent portions 132b to the ends thereof regardless of the thickness of the metallic plate. Furthermore, since the steps 132d are formed at the ends of the turned-down portions 132c, it is not necessary to form, for example, openings for engagement in the sidewalls 132 or engaging pieces formed by cutting and folding the sidewalls 132. As a result, the rigidity of the sidewalls 132 is not reduced.

EXAMPLE 2

Figure 3:
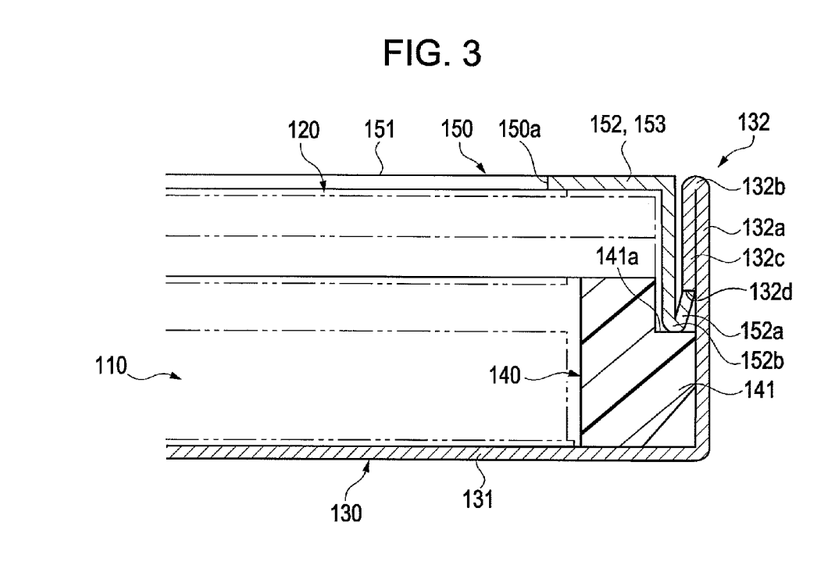
FIG. 3 is a fragmentary sectional view schematically illustrating the structure of a sidewall of a supporting frame of Example 2 according to the first embodiment.

FIG. 3 is a fragmentary sectional view schematically illustrating an example structure of Example 2. As shown in FIG. 3, the supporting frame 130 and the holding frame 150 are directly engaged with each other in this example. The supporting frame 130 is formed of a metallic plate as in the case shown in FIG. 2. The bent portions 132b are formed by folding the sidewalls 132 inward, the turned-down portions 132c folded at the bent portions 132b are superposed on the base portions 132a, and the ends of the turned-down portions 132c form the steps 132d. On the other hand, although not specified, the holding frame 150 is formed of a metallic plate as is the supporting frame 130 in the example shown in FIG. 3. Engaging projections 152a projecting outward are formed at the lower edges of the sidewalls 152 of the holding frame 150, and the ends of the engaging projections 152a are engaged with and held by the steps 132d. The engaging projections 152a can be steps formed at the ends of turned-down portions formed by folding the metallic plate outward at bent portions and superposing the folded portion on the outer surfaces of base portions as are the steps 132*d*.

In this example, the holding frame 150 is engaged with and held by the supporting frame 130, and at the same time, bent portions 152*b* of the engaging projections 152*a* of the holding frame 150 are in contact with the steps 141*a* of the projections 141 formed on the outer peripheral surfaces of the inner frame 140. With this, the inner frame 140 is engaged with and held by the supporting frame 130 and the holding frame 150.

Figure 10:
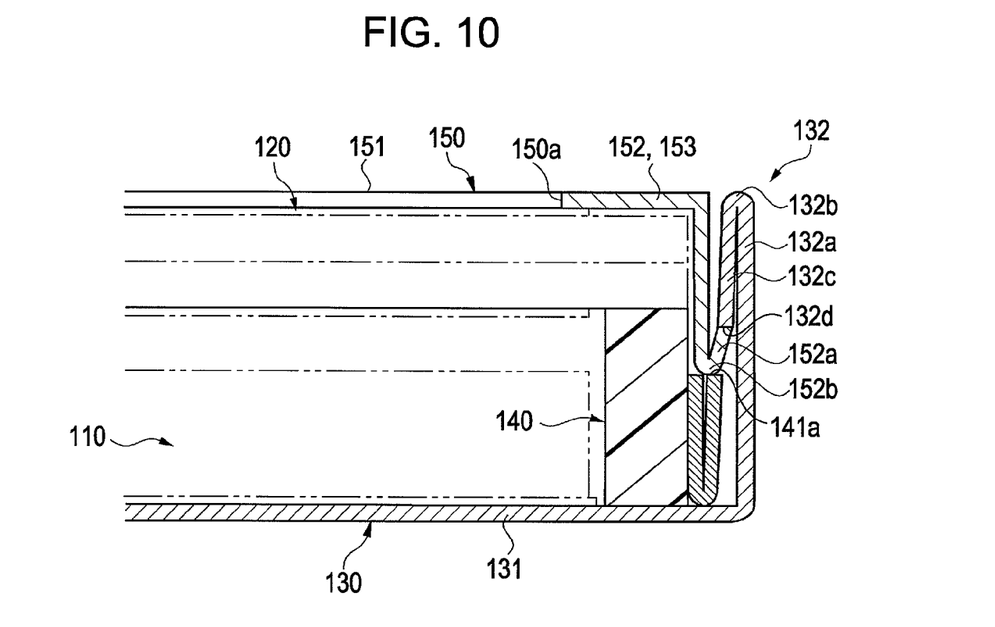
FIG. 10 is a fragmentary sectional view schematic illustrating an example in which a bent portion is formed on the inner frame and engaged with the supporting frame in the example structure of Example 2.

In this example, the supporting frame 130 is explained on the premise that the entire supporting frame is formed of a metallic plate. However, the supporting frame 130 can be partially formed of a metallic plate, and can be, for example, a unit into which a metallic plate and a synthetic-resin component are integrated. Moreover, the ends of the turned-down portions 132*c* of the supporting frame 130 constitute the steps 132*d* in this example. The same structure can be applied to the inner frame 140 or the holding frame 150. When the structure is applied to the inner frame 140, the structure shown in FIG. 10 can be adopted instead of that shown in FIG. 3. In this case, the inner frame 140 is engaged with the supporting frame 130 at the steps 141*a* instead of the projections 141. Furthermore, although the turned-down portions 132*c* are formed by folding the sidewalls 132 inward in the engaging structure, the turned-down portions 132*c* can be folded outward such that steps are formed on the outer surfaces of the sidewalls 132. In this case, the holding frame 150 is engaged with the supporting frame 130 outside the supporting frame. Therefore, the holding frame 150 is made larger than the supporting frame 130 when viewed in plan, and the engaging projections project inward.

Moreover, although the steps 132*d* are formed on the supporting frame 130 so as to hold other members in this example, the steps 132*d* can be used as a holding structure for holding various other members. For example, the steps 132*d* can be used for holding the peripheral edge portions of the electro-optical panel 120 inside the supporting frame 130.

Figure 4:
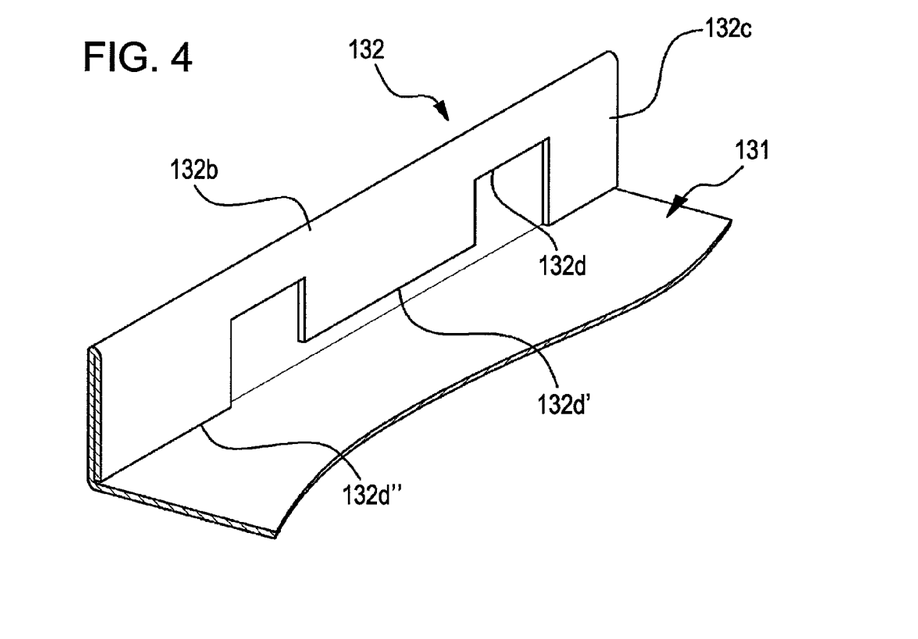
FIG. 4 is a partially sectioned perspective view schematically illustrating an example structure of a sidewall according to the first embodiment.

Moreover, in this example, the turned-down portions 132*c* extend in directions along which the sidewalls 132 of the supporting frame 130 extend (along the periphery of the bottom surface 131). With this, the rigidity of the sidewalls 132 can be further increased, and the holding power can also be increased. As regards the formation of the engaging steps, the turned-down portions 132*c* can be only partially formed in the directions along which the sidewalls 132 extend, or may be formed at different positions in the directions along which the sidewalls 132 extend so as to have different heights. For example, as shown in FIG. 4, the turned-down portions 132*c* can have the steps 132*d* at positions higher than those of other steps 132*d'* formed at different positions. Moreover, portions 132*d"* that do not form steps and are substantially in contact with the bottom surface 131 can be formed at the ends of the turned-down portions 132*c*. Even when the steps 132*d* and 132*d'* are formed at limited positions or the heights thereof differ from each other depending on the positions in this manner, the bent portions 132*b* are formed at the upper portions of the sidewalls 132 and the turned-down portions 132*c* are superposed on the base portions in the same manner as above. Thus, the rigidity of the sidewalls 132 can be increased, and the strength of the engaging structure can also be improved.

EXAMPLE 3

Figure 8A:
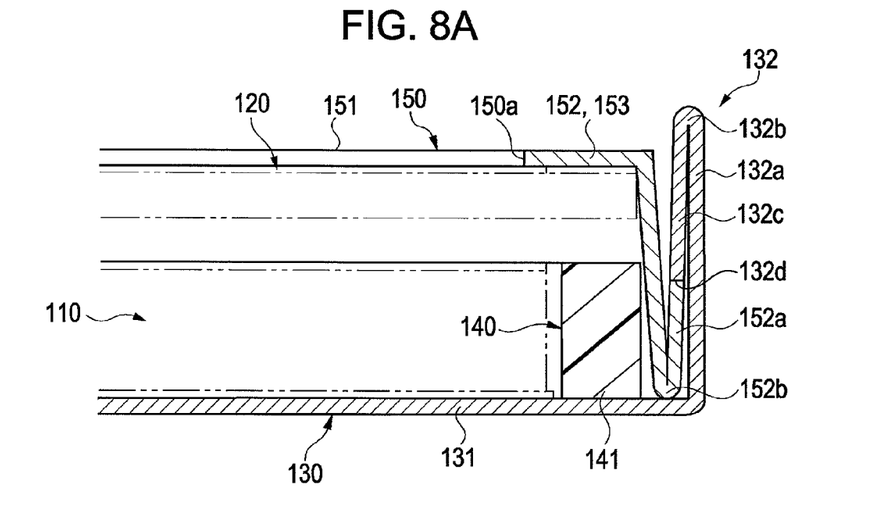
FIGS. 8A and 8B are fragmentary sectional views schematically illustrating an example structure of Example 3 according to the first embodiment.
Figure 8B:
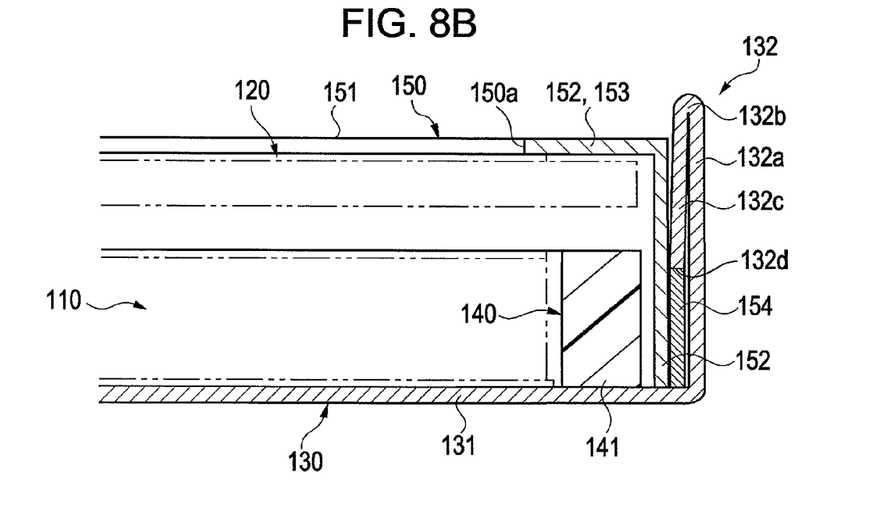

FIGS. 8A and 8B are fragmentary sectional views schematically illustrating another example structure of Example 3. As shown in FIG. 8A, the supporting frame 130 and the holding frame 150 are directly engaged with each other in this example. In addition, the bent portions 152*b* of the holding frame 150 are in direct contact with the bottom surface 131 of the supporting frame 130.

The supporting frame 130 is formed of a metallic plate as in the case shown in FIG. 2. The bent portions 132*b* are formed by folding the sidewalls 132 inward, the turned-down portions 132*c* are superposed on the inner surfaces of the base portions 132*a* from the bent portions 132*b*, and the ends of the turned-down portions (attachment areas) 132*c* form the steps 132*d*. On the other hand, although not specified, the holding frame 150 is formed of a metallic plate as is the supporting frame 130 in the example shown in FIG. 8A. The engaging projections 152*a* projecting outward are formed at the lower edges of the sidewalls 152 of the holding frame 150, and the ends of the engaging projections 152*a* are engaged with and held by the steps 132*d*. The holding frame 150 is held on the supporting frame 130 when the bent portions 152*b* are brought into direct contact with the bottom surface 131 of the supporting frame 130.

Moreover, as shown in FIG. 8B, instead of forming the engaging projections 152*a* by folding the sidewalls 152 of the holding frame 150 outward, step portions 154 can be formed by bonding metallic or resin components to the sidewalls 152 of the holding frame 150, or can be formed by integrating metallic or resin components into the sidewalls 152 of the holding frame 150. Since a process that requires a large stress for forming the bent portions 152*b* can be omitted, the deformation of the holding frame 150 can be reduced.

Furthermore, the number of sources of dimensional errors is small since the holding frame 150 and the supporting frame 130 are directly engaged with and fixed to each other in this example. As a result, the holding frame and the supporting frame can be positioned more accurately.

In this example, the supporting frame 130 is explained on the premise that the entire supporting frame is formed of a metallic plate. However, the supporting frame 130 can be partially formed of a metallic plate, and can be, for example, a unit into which a metallic plate and a synthetic-resin component are integrated.

Modification

Figure 9A:
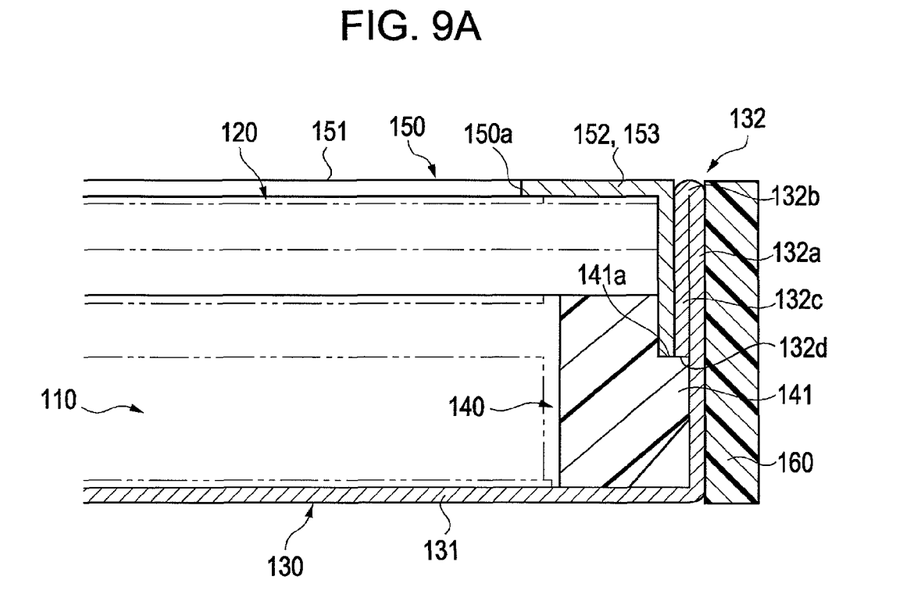
FIGS. 9A and 9B are fragmentary sectional views schematically illustrating a modification in which insert molding is employed.
Figure 9B:
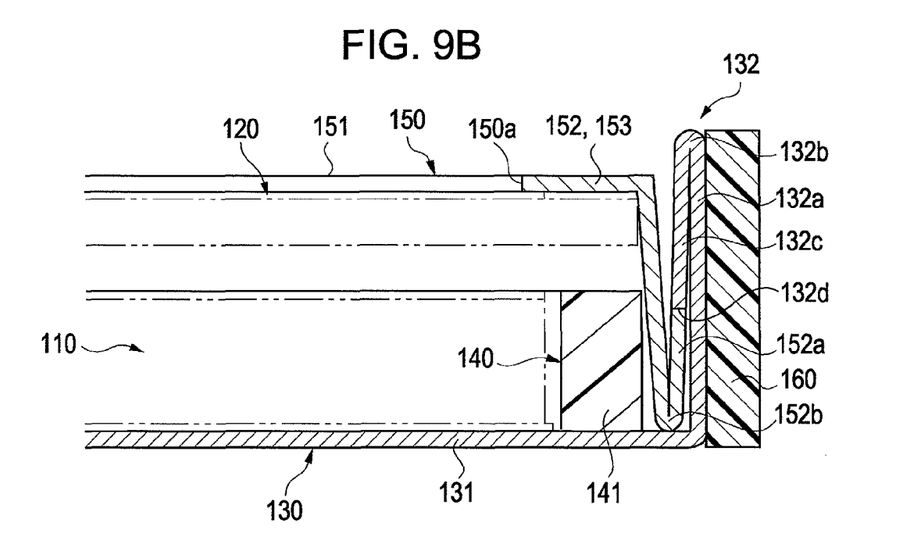

The inner frame 140 according to the first embodiment described with reference to FIGS. 2 and 3 is preferably formed by insert molding. When the inner frame 140 is formed by insert molding, the supporting frame 130 can be brought into close contact with the inner frame 140 compared with the case where the supporting frame is engaged with the inner frame 140. Therefore, the inner frame 140 also functions as a reinforcing member of the supporting frame 130, and can increase the strength of the electro-optical device 100 whose thickness is required to be reduced. Moreover, as shown in FIG. 9A, outer resin portions 160 can be formed outside the sidewalls 132 and 133 after the inner frame 140 is formed by insert molding. FIG. 9A illustrates a structure corresponding to that shown in FIG. 2 to which the outer resin portions 160 are added. Similarly, the outer resin portions 160 can also be added to the structure shown in FIG. 3. These outer resin portions 160 can reinforce the supporting frame 130. The inner frame 140 is not absolutely necessary when the outer resin portions 160 are added, and, for example, the outer resin portions 160 can be added to the structure shown in FIG. 8A by insert molding as shown in FIG. 9B. Also in this case, the effect of dispersing the stress applied on the electro-optical panel 120 can be achieved by using the outer resin portions 160.

Second Embodiment

Next, a second embodiment of the invention will be described with reference to FIG. 5. Since the electro-optical device according to this embodiment has a structure similar to that shown in FIG. 1, the same reference numbers and symbols are used for the same components, and the descriptions thereof will be omitted.

Figure 5:
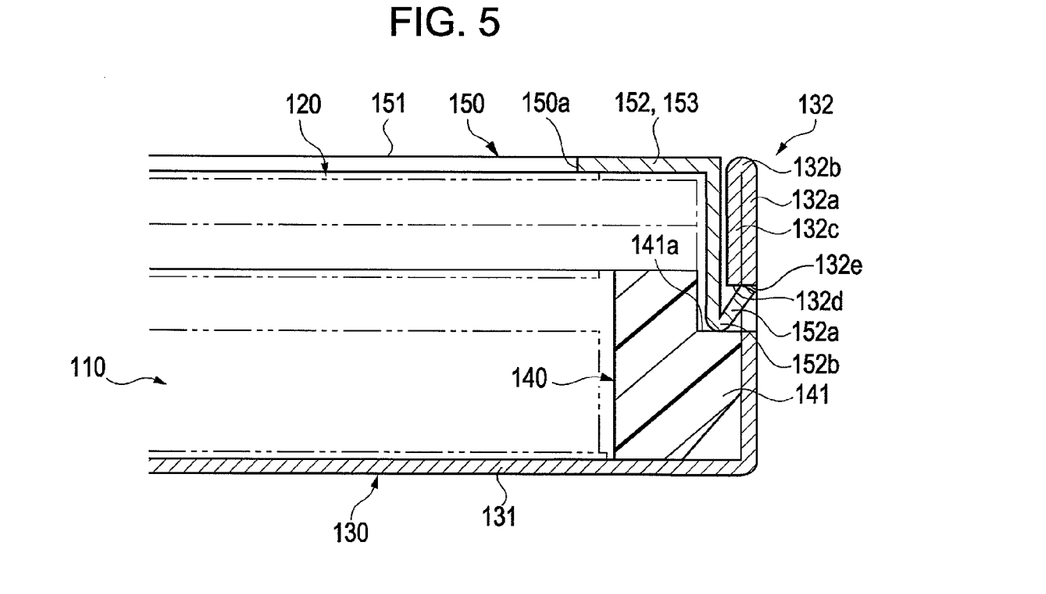
FIG. 5 is a fragmentary sectional view schematically illustrating the structure of a sidewall according to a second embodiment.

As shown in FIG. 5, the structure according to this embodiment is the same as that according to the first embodiment in that the turned-down portions 132*c* are formed by folding the sidewalls 132 at the bent portions 132*b* so as to be superposed on the base portions 132*a* and the ends of the turned-down portions 132*c* form the steps 132*d*, and the usage of the steps 132*d* is the same as that in the first embodiment.

In this embodiment, openings 132*e* are formed in the base portions 132*a* so as to face the steps 132*d* serving as the ends of the turned-down portions 132*c*. That is, the openings 132*e* are formed such that the ends of the turned-down portions 132*c* are located in opening areas when viewed in elevation. In the example shown in FIG. 5, the ends of the turned-down portions 132*c* are located at positions corresponding to the upper edges of the openings 132*e* when viewed in elevation.

In this embodiment, the openings 132*e* formed in the base portions 132*a* can sufficiently ensures the engaging depth of the steps 132*d* in addition to the thickness of the turned-down portions 132*c*. This can stabilize the engaging state and increase the flexibility in designing the engaging structure. In FIG. 5, the engaging projections 152*a* formed on the sidewalls 152 of the holding frame 150 are engaged with the steps 132*d* formed by the ends of the turned-down portions 132*c* and the edges of the openings 132*e*, and a large engaging depth of the engaging projections 152*a* is ensured compared with the example shown in FIG. 3. Thus, the engaging projections 152*a* can be securely held due to the more stabilized engaging state thereof, and flexibility in the shape and dimensions of the engaging projections 152*a* can be increased.

Electronic Device

Figure 6:
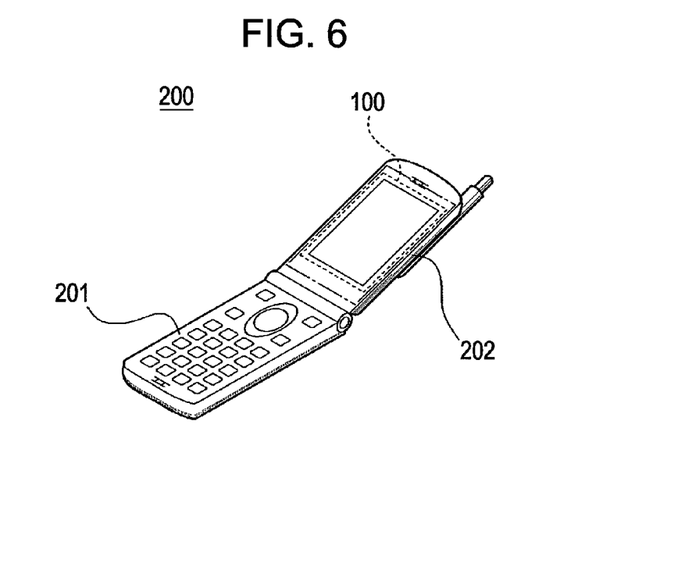
FIG. 6 is a schematic perspective view of a cellular phone.

Finally, an electronic apparatus according to an embodiment in which the electro-optical devices according to the above-described embodiments are installed will be described with reference to FIGS. 6 and 7. This electronic apparatus 200 shown in FIG. 6 includes the electro-optical device 100 according to any one of the above-described embodiments installed in the display portion thereof. FIG. 6 illustrates a cellular phone serving as an electronic apparatus according to an embodiment of the invention. The electronic apparatus 200 includes an operation unit 201 with, for example, a plurality of operation buttons and a mouthpiece and a display portion 202 with, for example, an earpiece, and the electro-optical device 100 is put inside the display portion 202. The display area 120A (see FIG. 1) of the electro-optical device 100 is visible on the top surface (inner area) of the display portion 202. In this case, a display control circuit for controlling the electro-optical device 100 (described below) is provided inside the electronic apparatus 200, and the display control circuit determines display modes of the electro-optical device 100.

In the electronic apparatus 200, the above-described holder can be at least partially formed of a frame fixed to the electronic apparatus 200 or the housing of the electronic apparatus 200. With this structure, the position of the display screen can be matched to that of the opening of the display portion 202 with high accuracy.

Figure 7:
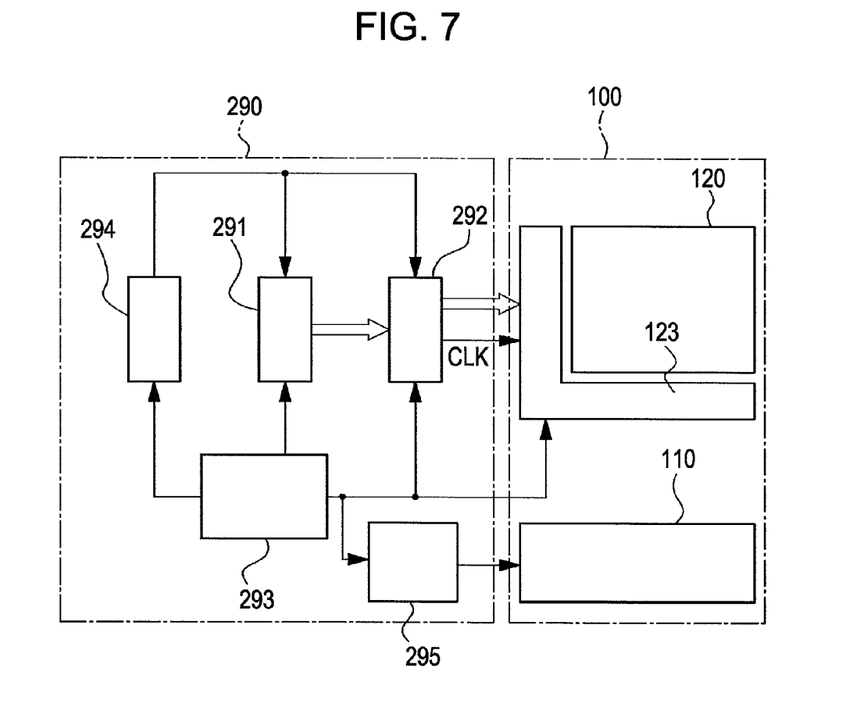
FIG. 7 schematically illustrates the structure of a control system in the electronic apparatus.

FIG. 7 schematically illustrates the overall structure of a control system (display control system) for electro-optical device 100 in the electronic apparatus. The electronic apparatus shown in FIG. 7 includes a display control circuit 290 having a display-information output source 291, a display-information processing circuit 292, a power supply circuit 293, a timing generator 294, and a light-source control circuit 295 that supplies power to the lighting unit 110. Moreover, the electro-optical device (liquid-crystal display) 100 includes the electro-optical panel 120 having the above-described structure, the driving circuit 123 that drives the electro-optical panel 120, and the lighting unit (lighting device) 110 serving as a backlight for illuminating the electro-optical panel 120. Although the driving circuit 123 is an electronic component directly mounted on the electro-optical panel 120 as described above in the above-described embodiments, the driving circuit can be a circuit pattern formed on the top surface of the substrate of the electro-optical panel 120, can be a circuit board electrically connected to the electro-optical panel 120, or can be a semiconductor IC chip or a circuit pattern formed on another electronic component, for example, the wiring board 124.

The display-information output source 291 includes a memory such as a read-only memory (ROM) or a random access memory (RAM), a storage unit such as a magnetic recording disk or an optical recording disk, and a tuning circuit that synchronously outputs digital image signals. The display-information output source 291 supplies display information in the form of, for example, image signals in a predetermined format to the display-information processing circuit 292 on the basis of various clock signals generated by the timing generator 294.

The display-information processing circuit 292 includes various known circuits such as a serial-parallel conversion circuit, an amplifying/inverting circuit, a rotation circuit, a gamma-correction circuit, and a clamping circuit. The display-information processing circuit 292 processes the input display information, and supplies the display information to the driving circuit 123 together with clock signals CLK. The driving circuit 123 includes a scanning-line driving circuit, a signal-line driving circuit, and an inspection circuit. Moreover, the power supply circuit 293 supplies predetermined voltages to the above-described components.

The light-source control circuit 295 supplies power to the light source of the lighting unit 110 on the basis of the voltage supplied by the power supply circuit 293, and controls, for example, the light emission from the light source and the brightness on the basis of predetermined control signals.

The electronic apparatus according to the invention includes liquid-crystal televisions, car navigation systems, pagers, electronic notepads, calculators, workstations, videophones, and point-of-sale (POS) terminals in addition to the cellular phone shown in FIG. 6. The electro-optical devices (liquid-crystal displays) according to the invention can be used as displays of the above-described various electronic apparatuses.

The invention is not limited to the above-described examples shown in the drawings, and various modifications are possible within the scope of the invention. For example, the liquid-crystal displays with the liquid-crystal display panels serving as examples of electro-optical panels are described in the above-described embodiments. However, the electro-optical devices of the invention are not limited to the liquid-crystal displays, and can be other electro-optical devices such as organic electroluminescence displays or electrophoretic displays.

The entire disclosure of Japanese Patent Application Nos: 2007-168594, field Jun. 27, 2007 and 2008-120212, field May 2, 2008 are expressly incorporated by reference herein.

What is claimed is:

1. An electro-optical device comprising:
an electro-optical panel;
a holder that includes a bottom surface and a plurality of sidewalls that extend from a periphery of the bottom surface to define a space between the bottom surface and the plurality of sidewalls, the sidewalls each extending from the bottom surface and including a bent portion opposite the bottom surface that folds over into the space, the sidewalls also each including a turned down portion extending from the respective bent portion to be superposed on an inner surface of the sidewall, the turned down portions each defining a respective step on an end that is opposite the respective bent portion; and
an inner frame that is received in the space, the inner frame including a projection that extends from a periphery thereof, the projection abutting the steps and retained between the steps, the inner surfaces of the sidewalls, and the bottom surface, the inner frame supporting the electro-optical panel within the space.

2. The electro-optical device according to claim 1, wherein the inner frame is at least partially composed of resin.

3. An electronic apparatus comprising:
the electro-optical device according to claim 1; and
a controller of the electro-optical device.

4. The electro-optical device according to claim 1, wherein the electro-optical panel is fixed directly to the inner frame.

5. The electro-optical device of claim 1, wherein the projection of the inner frame abuts the step of the holder, the inner surface of the side wall, and the bottom surface to be retained in a fixed position between the step of the holder, the inner surface of the side wall, and the bottom surface.

6. The electro-optical device of claim 1, wherein the sidewall is resiliently flexible.

7. An electro-optical device comprising:
an electro-optical panel;
an accommodating member with a bottom surface and a plurality of sidewalls that each extend from a periphery of the bottom surface to define a space accommodating the electro-optical panel, at least one of the plurality of sidewalls including a bent portion opposite the bottom surface to define a turned down portion extending from the bent portion into the space, the turned down portion being superposed on an inner surface of the sidewall, the turned down portions each defining a step; and
a supporting member disposed inside the space of the accommodating member and including a projection that extends from a periphery thereof, the projection abutting the steps and retained between the steps, the inner surfaces of the sidewalls, and the bottom surface of the accommodating member, the supporting member supporting the electro-optical panel within the space.

8. An electro-optical device comprising:
an electro-optical panel;
an accommodating member with a bottom surface and a plurality of sidewalls that extend from a periphery of the bottom surface to define a space between the bottom surface and the plurality of sidewalls, each of the plurality of sidewalls including a base portion, a bent portion, and a turned down portion, each of the base portions extending from the periphery of the bottom surface, each of the bent portions extending from the respective base portion opposite the bottom surface and folded inward into the space, each of the turned down portions superposed on an inner surface of the respective base portion and extending from the respective bent portion to define a respective step on an end that is opposite the respective bent portion, the electro-optical panel being received in the space of the accommodating member;
an attachment member with a bottom surface and sidewalls accommodated in the space of the accommodating member, the electro-optical panel being disposed between the accomodating member and the attachment member; and
a supporting member including a projection formed on an outer peripheral surface thereof, the supporting member disposed inside the space of the accommodating member, the projection abutting the steps of the sidewalls, the inner surfaces of the sidewalls, and the bottom surface of the accommodating member to be retained in a fixed position between the bottom surface of the accommodating member, the inner surfaces of the sidewalls, and the steps formed on the sidewalls of the accommodating member, the supporting member supporting the electro-optical panel within the space.

9. The electro-optical device according to claim 8, wherein a part of the attachment member is disposed between the accommodating member and the supporting member.

* * * * *